United States Patent

Barthe et al.

(10) Patent No.: US 9,513,842 B2
(45) Date of Patent: Dec. 6, 2016

(54) WRITING DATA IN A NON-VOLATILE MEMORY OF A SMART CARD

(71) Applicant: MORPHO, Issy-les-Moulineaux (FR)

(72) Inventors: Michael Barthe, Paris (FR); Geoffrey Spinau, Paris (FR)

(73) Assignee: MORPHO, Issy-les-Moulineaux (FR)

( * ) Notice: Subject to any disclaimer, the term of this patent is extended or adjusted under 35 U.S.C. 154(b) by 129 days.

(21) Appl. No.: 14/361,941

(22) PCT Filed: Nov. 30, 2012

(86) PCT No.: PCT/FR2012/052770
§ 371 (c)(1),
(2) Date: May 30, 2014

(87) PCT Pub. No.: WO2013/079885
PCT Pub. Date: Jun. 6, 2013

(65) Prior Publication Data
US 2014/0351494 A1    Nov. 27, 2014

(30) Foreign Application Priority Data
Dec. 2, 2011   (FR) ...................................... 11 61102

(51) Int. Cl.
*G06F 12/00*   (2006.01)
*G06F 3/06*    (2006.01)
(Continued)

(52) U.S. Cl.
CPC ............. *G06F 3/0659* (2013.01); *G06F 3/061* (2013.01); *G06F 3/0604* (2013.01);
(Continued)

(58) Field of Classification Search
None
See application file for complete search history.

(56) References Cited

U.S. PATENT DOCUMENTS 5,608,902 A * 3/1997 Iijima .................. G06Q 20/341
707/697
6,484,937 B1 * 11/2002 Devaux ............. G06F 17/30952
235/380
(Continued)

FOREIGN PATENT DOCUMENTS

FR         2 842 622 A1    1/2004

OTHER PUBLICATIONS

Search Report for PCT/FR2012/052770, mailed Apr. 10, 2013.
(Continued)

*Primary Examiner* — Kaushikkumar Patel
(74) *Attorney, Agent, or Firm* — Marshall, Gerstein & Borun LLP (57) ABSTRACT

A smart card compares an object identification parameter associated with a write command with an object identification parameter stored in the non-volatile memory of the smart card. If the comparison is positive, the data embedded in the write command is written at a at a predefined address whose value is stored in the non-volatile memory, an address corresponding to the sum of the stored predefined address and the size of the written data is calculated, and the calculated address is stored in the non-volatile memory in place of the predefined address. If the comparison is negative, the data is written at a default address, an address corresponding to the sum of the default address and the size of the written data is calculated, and the calculated address is stored in the non-volatile memory as the predefined address.

9 Claims, 2 Drawing Sheets (51) Int. Cl.
*G06F 12/02* (2006.01)
*G11C 16/10* (2006.01)

(52) U.S. Cl.
CPC .......... *G06F 3/0643* (2013.01); *G06F 3/0679* (2013.01); *G06F 12/0246* (2013.01); *G11C 16/102* (2013.01)

(56) References Cited

U.S. PATENT DOCUMENTS

| | | | |
|---|---|---|---|
| 2003/0033496 A1* | 2/2003 | Takagi | G06Q 20/341 711/163 |
| 2005/0234855 A1* | 10/2005 | Nishimura | G06F 17/30961 |
| 2006/0079254 A1 | 4/2006 | Hogan | |
| 2007/0145157 A1* | 6/2007 | Shikata | G06F 21/556 235/492 |
| 2007/0186037 A1* | 8/2007 | Winzenried | G06F 21/78 711/111 |
| 2009/0177921 A1* | 7/2009 | Kuriyama | G06F 13/385 714/16 |
| 2009/0187709 A1 | 7/2009 | Chen et al. | |
| 2009/0307291 A1* | 12/2009 | Ye | G06F 3/0608 |
| 2009/0319587 A1* | 12/2009 | Nakanishi | G06F 12/0246 |
| 2010/0235393 A1* | 9/2010 | Noumi | G06F 17/30557 707/781 |
| 2011/0016274 A1* | 1/2011 | Ohnuma | G06F 12/0223 711/115 |

OTHER PUBLICATIONS

Written Opinion for PCT/FR2012/052770, mailed Apr. 10, 2013.
International Standard, ISO/IEC 7816-3, "Identification cards—Integrated circuit cards—Part 3: Cards with contacts—Electrical interface and transmission protocols," Third Edition, Nov. 1, 2006.
International Standard, ISO/IEC, 7816-4, "Identification cards—Integrated circuit cards—Part 4: Organization, security and commands for interchange," Second Edition, Jan. 15, 2005.

* cited by examiner

WRITING DATA IN A NON-VOLATILE MEMORY OF A SMART CARD

FIELD OF THE INVENTION

The invention relates to writing data in a non-volatile memory of a smart card.

BACKGROUND OF THE INVENTION

Smart cards typically contain both non-volatile memory and volatile memory.

"Non-volatile" memory is memory that can store data without requiring external power. Non-volatile memory can be programmable (examples are EEPROM memory, flash memory, etc.) or non-programmable (an example is ROM memory, whose content is defined once and for all at manufacture). Programmable non-volatile memories are often used to store data or applications that can vary from one card to another, for example a file system containing different directories and subdirectories, files with data specific to the cardholder (name, contact information, etc.), JavaCard applets, etc. Smart cards typically have a capacity of about 8 KB to 256 KB of programmable non-volatile memory (usually EEPROM). Non-programmable non-volatile memory is often used to store an operating system, and (more generally) data that is unlikely to change from one card to another. Smart cards typically have a capacity of about 64 KB to 512 KB of ROM. Of course, other amounts of RAM, EEPROM or ROM also exist. Some smart cards use flash memory instead of ROM and EEPROM together.

"Volatile" memory (such as RAM memory) is memory that loses its content when the external power supplied to it is interrupted. Volatile memory is typically much faster than non-volatile memory, especially for write operations. For example, a write to EEPROM or flash memory is generally much slower than a RAM write. Volatile memory is used for example to store temporary data (state variables, calculation results, etc.) during the execution of software. Smart cards typically include RAM memory, which is usually between 2 KB and 8 KB. Much of this RAM is generally occupied by variables (particularly for the card's operating system) and by different applications. Part of the RAM is generally occupied by a buffer, which is typically a few hundred bytes in size and is dedicated to receiving commands.

A smart card generally does not allow outside entities to write to any of its memory by absolute addressing. Instead, smart cards typically offer an interface (such as an ISO 7816-4 interface) through which an outside entity can send commands to the card (including read or write commands). The commands are received in the buffer. It is the card itself which is responsible for executing the commands received, and it can choose to process them or reject them, prohibit certain accesses, subject some accesses to authentication, etc. According to the T=0 protocol of the ISO 7816-4 standard, which is the most common protocol, the commands contain five bytes (class byte, instruction byte, and three bytes of parameters P1, P2 and P3), optionally followed by data (for example data to be written to the card). The length of any such data is usually specified by byte P3, and therefore no more than 255 bytes (plus the previous 5 bytes) are sent at once. This, however, requires a buffer of at least 260 bytes. Other variants and other protocols also exist (such as the T=1 protocol, which theoretically is able to send and receive up to 64 KB of data in a command).

Given the relatively small size of the buffer, and the limitations of the T=0 protocol, it is generally not possible to send very long commands to the card. If more than 255 bytes is to be written to a file on the card (T=0), the data is usually divided into smaller subsets (for example blocks of 255 bytes), and as many write commands as there are blocks are sent.

For example, the UPDATE BINARY command (instruction 0xD6 of the ISO 7816-4 standard) can be used, which allows writing to a so called "transparent" file. This is a file of type EF (Elementary File), to which one can write by specifying the target (between 0x0000, for the beginning of the file, and the address corresponding to the size of the file minus at least one byte, if you want to modify the last byte of the file). However, this requires that the sending entity calculate not only the data subsets (blocks of 255 bytes), but also the address where each block in the target file is to be written, which is impractical.

It is also known to use an UPDATE RECORD command (instruction 0xDC of the ISO 7816-4 standard), which allows creating an EF file of records with each record identified by an index. It is possible for each record to have a different size (depending on the card). However, this requires calculating record indexes, which is impractical. In addition, it is sometimes necessary to write blocks of one size (for example blocks of 11 bytes), but to read blocks of another size (for example blocks of 13 bytes); in this case the structure of a file of records is highly impractical because the data to be read straddle multiple records and record portions.

It is also known to use a PUT DATA command (instruction 0xDA of the ISO 7816-4 standard). The standard specifies that, depending on the object selected (which the PUT DATA command is to write to), it is possible to execute a "writing once" operation or an "updating" operation or an "appending" operation. However, the procedure of the "appending" operation is not specified in the standard.

SUMMARY OF THE INVENTION

The invention aims to improve the situation.

One aspect of the invention relates to a method for writing data in a non-volatile memory of a smart card, comprising:

/a/ the receiving of a write command in a buffer in a volatile memory of the smart card, /b/ the comparison by the smart card of an object identification parameter associated with the write command, with an object identification parameter stored in the non-volatile memory of the smart card, /c/ if the comparison is positive, /c1/ the data to be written, embedded in the write command, is written from the buffer to the object associated with the write command, at a predefined address whose value is stored in the non-volatile memory, /c2/ an address corresponding to the sum of the stored predefined address and the size of the written data is calculated, /c3/ the calculated address is stored in the non-volatile memory in place of the predefined address, /d/ if the comparison is negative, /d1/ the data to be written, embedded in the write command, is written from the buffer to the object associated with the write command, at a default address, /d2/ an address corresponding to the sum of the default address and the size of the written data is calculated, /d3/ the calculated address is stored in the non-volatile memory as the predefined address.

This method is advantageous in that it provides a simple manner of writing large amounts of data in the smart card. It allows writing data of a length greater than the size of the buffer to the card, as well as data exceeding the limit of 255 bytes imposed by the T=0 protocol, without requiring the entity sending the data to calculate addresses or indexes. This is especially useful in cards making use of biometric techniques such as "match-on-card" techniques which allow the card itself to authenticate biometric data. Indeed, biometric data (for example fingerprints or facial recognition data) can be very large, up to several kilobytes.

One aspect of the invention relates to a computer program comprising a series of instructions which, when executed by a processor of a smart card, implement a method according to an aspect of the invention.

One aspect of the invention relates to a non-transitory computer-readable storage medium which stores a computer program according to one aspect of the invention.

One aspect of the invention relates to a smart card comprising a non-volatile memory, a volatile memory, a buffer contained in the volatile memory, and a circuit for processing write commands for writing in non-volatile memory, the circuit being arranged to process a command stored in the buffer and associated with a parameter identifying an object stored in the non-volatile memory to which the command is to write, said circuit being arranged to store in the non-volatile memory a parameter identifying an object stored in the non-volatile memory, and a predefined address inside this object, the circuit being arranged, when processing a write command, to compare the object identification parameter associated with the write command with the object identification parameter stored in non-volatile memory, and, if the comparison is positive, to write the data to be written, embedded in the write command, from the buffer to the object associated with the write command, at the predefined address stored in the non-volatile memory, calculate an address corresponding to the sum of the stored predefined address and the size of the written data, as well as store the calculated address in the non-volatile memory in place of the predefined address, the circuit being arranged, if the comparison is negative, to write the data to be written, embedded in the write command, from the buffer to the object associated with the write command, at a default address, calculate an address corresponding to the sum of the default address and the size of the written data, and store the calculated address in the non-volatile memory as the predefined address.

One aspect of the invention relates to a system comprising an electronic device and a smart card according to an aspect of the invention, the electronic device being arranged to separate the data to be written by the device to the smart card into subsets such that the size of each subset is at most equal to a predetermined value, construct a set of write commands associated with a same object of the card, each write command comprising a respective subset of data to be written, and send each write command constructed in this manner to the card.

Other features, objects, and advantages of the invention will be apparent but in a non-limiting manner from the description of some of its embodiments.

BRIEF DESCRIPTION OF THE DRAWINGS

The invention will also be better understood by referring to the drawings, in which.

DETAILED DESCRIPTION

One possible embodiment relates to a method for writing data in a non-volatile memory (such as EEPROM or flash memory) of a smart card. The method includes receiving a write command. This command may be, for example, a command formatted as a PUT DATA command of the ISO 7816-4 standard, but functionally modified in the manner specified below. It is possible to use for this write command an instruction code that differs from the value 0×DA or 0×DB specified for the instruction code INS by the ISO 7816-4 standard (such as an unused instruction code), to allow also using the conventional PUT DATA command. This received write command may thus include a header containing different parameters such as the type of command (its instruction code INS in the case of a command according to the ISO 7816-4 standard), and the data to be written. This command is received from an entity external to the card (such as a bank terminal, a mobile phone, or a smart card reader connected to a computer), in a buffer in the volatile memory (such as RAM) of the smart card. In particular, it may be received through the I/O interface of the smart card (for example using the I/O contacts specified by the ISO 7816-3 standard).

The method includes the comparison, by the smart card, of an object identification parameter associated with the write command with an object identification parameter stored in the non-volatile memory of the smart card. The command can thus be associated with a certain object of the card, such as an EF file. This association has the effect that the command writes the data it contains in the object with which it is associated. The object identification parameter stored in the non-volatile memory can identify the last object to which the smart card was directed to write by another (write) command according to an embodiment of the invention. This other command is a command of the same type, for example it has the same instruction code, meaning the same INS byte as defined by the ISO 7816-4 standard, and only differs for example in its parameters (for example the parameters P1, P2 and P3 as defined in the T=0 protocol) and its data (which in the case of the T=0 protocol are the bytes following the fifth byte of the command). When the card is initialized (for example during its first use or whenever it is connected to a power source), it is possible to save, as an object identification parameter stored in non-volatile memory, a default value which does not correspond to any possible object (for example the value zero, or any other value chosen arbitrarily and conventionally for this purpose). The comparison between this default value and the object identification parameter associated with the write command is therefore necessarily negative.

If the comparison is positive, meaning that the write command tries to write to the same object as the one written to by the last write command of the same type, the method may implement the following steps.

A first step comprises the writing of the data to be written (which are included in the write command), from the buffer (where they are stored after receiving the write command of which they are a part) to the object associated with the write command, at a predefined address whose value is stored in the non-volatile memory. The card can therefore read the value of the predefined address from the non-volatile memory, then write in the object at the predefined address. This predefined address is preferably a relative address within the object. The card can thus write to an absolute address equal to the sum of the address of the object (expressed as an absolute address) and the predefined address. Of course, the card may implement safety mechanisms to ensure that the write operation takes place within the object concerned (for example by checking that the address, which is equal to the sum of the predefined address and the size of the data to be written minus one, is indeed within the object).

A second step includes calculating an address corresponding to the sum of the stored predefined address and the size of the written data. This corresponds to the address immediately following the last byte written.

A third step comprises storing the calculated address in the non-volatile memory in place of the predefined address. In this manner, the next invocation of a write command of the same type will write, provided that this command of the same type is associated with the same object, immediately after what was just written, without the entity (for example a mobile phone) responsible for constructing and sending this write command having needed to store the previous address or calculate the new address.

If the comparison is negative, meaning that the write command wants to write to a different object than the one written to by the last write command that was invoked of the same type, or if it is the first time that this type of write command is invoked, the method can carry out the following steps.

A first step includes writing the data to be written that are embedded in the write command, from the buffer to the object associated with the write command, at a default address. The default address is advantageously a relative address within the object. The card can then write to an absolute address equal to the sum of the address of the object (expressed as an absolute address) and the default address. Of course, the card may implement safety mechanisms to ensure that the write operation takes place within the object concerned (for example by checking that the address, which is equal to the sum of the default address and the size of the data to be written minus one, is indeed within the object).

A second step includes calculating an address corresponding to the sum of the default address and size of the written data. This corresponds to the address immediately following the last byte written.

A third step includes storing the calculated address in the non-volatile memory as a predefined address. In this manner, the next invocation of a write command of the same type will write, provided that this command of the same type is associated with the same object, immediately after what was just written, without the entity (for example a mobile phone) responsible for constructing and sending this write command having needed to store the previous address or calculate the new address.

One possible embodiment concerns a method wherein the object identification parameter associated with the write command is embedded in the write command. In this manner, one can for example use the parameters P1 and P2 to store an identifier (File ID, abbreviated as FID, as defined in the ISO 7816-4 standard) of an object (for example an Elementary File EF as defined in the ISO 7816-4 standard). For example, in the event that the command is based on the UPDATE BINARY command as defined in the ISO 7816-4 standard, the parameters P1 and P2, which are supposed to represent an internal address of the object to be written to, are no longer necessary and can be replaced by the File ID identifying the object to be written to.

One possible embodiment concerns a method wherein the object identification parameter associated with the write command is stored in the volatile memory, and is updated by an object selection command of the smart card. For example, it is possible to use the SELECT command as defined in the ISO 7816-4 standard (which uses the value 0×A4 for the instruction code INS) to select an EF to which a subsequent write command will automatically write without the write command having to indicate explicitly the object it is to write to.

One possible embodiment concerns a method wherein the default address is the zero address. Thus, each time a write command according to an embodiment of the invention writes to an object when the last write command that was invoked of the same type (if there was one) wrote to another object, and each time this is the first time that a write command of this type is invoked (for example the first time in a particular session, or the first time after connecting the card to a power source, or the very first time since the manufacture of the card), the method writes to the zero address. This is obviously a zero address relative to the object in question, and which corresponds to the beginning of the object.

Alternatively, it is possible to use a default address that is different than zero. For example, if the structure of the objects to be written to by the write command according to an embodiment of the invention is such that only certain addresses can be written to, and not at the beginning of the object (which contains for example administrative data managed by the card itself), it is possible to use a valid address within this object as the default value.

This default value, when common to all objects and when the method is implemented by software, can be stored in the actual code (the code can be stored in ROM for example).

The default address may vary between object types (the card storing different default addresses for each object type, for example). In this case, different default values may be stored in a table in ROM, for example. They may be stored in a table in EEPROM or flash memory if they are able to change, or if the card developer is unable to anticipate the types of objects used. The types of objects may be, for example: transparent EF file storing fingerprints, transparent EF file storing facial recognition data, transparent EF file storing dates, transparent EF file storing locations, transparent EF file storing geographical addresses (such as street number, street name, city, country), etc. One can see that an object type does not necessarily (although it may) correspond to a file type (such as the ISO 7816-4 "transparent EF" file type), but may correspond to a lower level subdivision corresponding to the contents of these files which is not part of a definition of the smart card operating system, but of a definition of an entity using the smart card. In this case, a table in EEPROM or flash memory is generally more suitable.

It is also possible for a default value to be associated with each specific object (i.e. for each object instance, meaning that two different objects of the same type can be associated with two different default values). Two transparent EF files containing fingerprints can thus be associated with different default values. This default value can be zero (or another value, depending on the type of object, as described in the previous paragraph) when the object is created, then can be updated. It may be stored within the object or with the object, in the rewritable non-volatile memory (EEPROM or flash memory for example). In one possible embodiment, the smart card stores only one predefined value, regardless of the number of objects. This predefined value is reinitialized each time a write command according to an embodiment of the invention writes to a new object (meaning an object that is not the object written to by the last command of the same type that was executed, or a first object). In this case, updating the default value stored for a given object may be achieved by copying the predefined value associated with this object, in order to use it as the default. Thus, if an external entity writes, using write commands of the same type, to a first object and then to a second, and then again to the first, it writes to the first object following where it originally wrote, without overwriting the initially written values. In the case where the smart card implements an automatic update of the default value, it is advantageous to provide, within the card, a command that reinitializes the default value, which may for example assign the value that was assigned when the object was created. It is thus possible, with a write command according to an embodiment of the invention, to replace data previously written to the object using a write command according to an embodiment of the invention.

One possible embodiment concerns a method wherein the command is encoded as an APDU command according to the ISO 7816-4 standard. The write command may be an APDU command, and the selection command may also be an APDU command (it may be the SELECT command according to the ISO 7816-4 standard). The command for reinitializing the default value, if there is one, may also be an APDU command.

Figure 1:
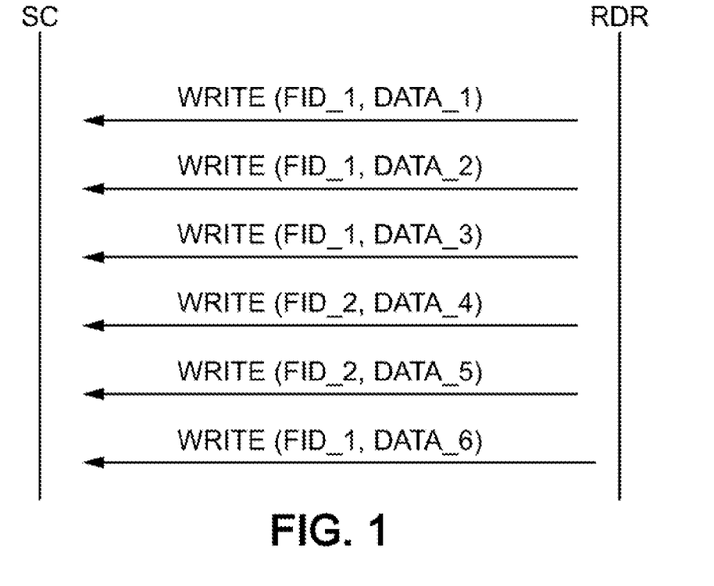
FIG. 1 illustrates six consecutive executions of a method according to an embodiment of the invention.
Figure 2:
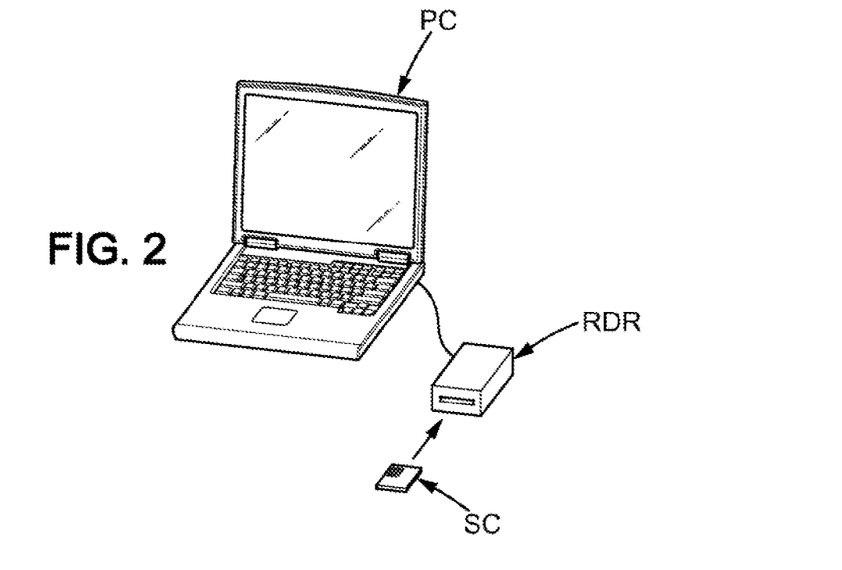
FIG. 2 illustrates a system consisting of a portable computer, a smart card reader connected to the computer, and a smart card according to an embodiment of the invention.

FIG. 1 illustrates a repeated use of a method according to an embodiment of the invention. A reader RDR sends a first write command WRITE(FID_1, DATA_1) to a smart card SC according to an embodiment of the invention. The smart card receives for the first time a WRITE instruction to write to the file having the identifier FID_1. It therefore writes the data DATA_1 at the beginning of the file. The reader sends a second write command WRITE(FID_1, DATA_2) to the smart card. The card then writes the data DATA_2 after the data DATA_1. The reader sends a third write command WRITE(FID_1, DATA_3) to the smart card. The card then writes the data DATA_3 after the data DATA_2. The reader sends a fourth write command WRITE(FID_2, DATA_4) to the smart card. The card detects that it has received a command to write to a different file than the one just written to. It therefore writes the data DATA_4 at the beginning of the file having the identifier FID_2. The reader sends a fifth write command WRITE(FID_2, DATA_5) to the smart card. The card then writes the data DATA_5 after the data DATA_4 in the file with the identifier FID_2. The reader sends a sixth write command WRITE(FID_1, DATA_6) to the smart card. The card detects it that it has received a command to write to a different file than the one just written to. It looks up the default address for the file having the identifier FID_1 that was updated by previous writes to said file and therefore writes the data DATA_6 after the data DATA_3.

This operation is particularly advantageous when running multiple applications on the device with multitasking, and these applications could send write commands to the card. The card can then alternate the writes to different files, and the applications on the device do not need to worry about the details of the file organization or calculate the addresses for the writes. In one extreme case, various applications that do not necessarily communicate with each other may need to write to the same file on the smart card, such as a log file that records events as they occur. Neither of the applications would be able to determine by itself the address where it should write the new event.

In another embodiment (not shown), the smart card contains two empty objects (O1 and O2). The method comprises the receiving of consecutive write commands (for example for writing the following biometric data D1 to D7):

Write (O1, D1),
Write (O1, D2),
Write (O1, D3),
Write (O2, D4),
Write (O2, D5),
Write (O1, D6), then
Write (O1, D7).

The data D1, D2 and D3 are then concatenated in object O1, as object O2 is still empty, then the data D4 and D5 are concatenated in object O2 (data D1, D2 and D3 are still in object O1), and finally the data D1, D2 and D3 of object O1 are lost (overwritten), the data D6 and D7 being concatenated in object O1 in place of the data D1 to D3. As soon as the object changes (for example when the FID changes), the write is at the beginning of the newly selected object and overwrites the old data. If the concatenation of data D1 to D3 is longer than the concatenation of data D6 and D7, the remainder may remain physically in the memory of the smart card (after the D7 data) without being considered as being in object O1 from a logical point of view. For example, object O1 may comprise a parameter indicating its current size (in this case corresponding to the size of the concatenation of data D6 and D7), and any information stored beyond this size can be ignored. Not deleting the residual remainder reduces the number of write operations in non-volatile memory (deletion is a form of writing), which can be advantageous, particularly for faster processing (fewer write operations) or for extending the life of the non-volatile memory (each write operation degrades the memory which is only guaranteed for a certain number of write cycles).

One possible embodiment concerns a method for writing data in a non-volatile memory of a smart card, by an electronic device such as a mobile phone, a bank terminal, etc.

The method includes a separation into subsets, by the device, of the data to be written. The subsets are such that the size of each subset is at most equal to a predefined value. This value can be defined, for example, as the maximum amount of data to be written that can be sent in a write command according to an embodiment, the write command being equal in size to the lowest value between the size of the buffer in the volatile memory of the smart card (receiving the commands), and the maximum size of a command (for example, in T=0 a write command is at most 260 bytes, and therefore no more than 255 bytes can be sent).

For example, a terminal for verifying biometric passports (which are a particular form of smart card) can capture the fingerprint of a person claiming to be the passport holder (for example at border control in an airport) and divide it into contiguous segments of 255 bytes. At least one of the segments, for example the last segment, may be smaller if the size of the print in bytes is not a multiple of 255. Each segment then corresponds to one of the above subsets.

This method comprises the construction of a set of write commands associated with a same object of the smart card, each write command containing a respective subset of data to be written.

For example, the command may be constructed by preceding each data subset, for example each block of 255 bytes representing a portion of the fingerprint, with the header of the write command.

The header can take the form {CLA, INS, P1, P2, P3}, where the values CLA, INS, P1, P2 and P3 are each one byte, the resulting command then having a size of 260 bytes. P3 may be equal to 0xFF to indicate that 255 bytes of data to be written follow the five header bytes. P1 and P2 may be equal to zero. Alternatively, P1∥P2 may represent the identifier of a file where the write command is to write the data. The INS byte may, for example, be any value not specified by the ISO 7816-4 standard or any value specified but not used by the smart card concerned. The ISO 7816-4 standard does not require implementing all the instructions it specifies. This last option (reuse of a standard instruction code not previously used in the card) results in a card that does not strictly adhere to the ISO 7816-4 standard. This non-compliance is not necessarily a problem, depending on the application. The class byte (CLA) can take any appropriate value.

This method includes the sending of each write command, by the device to the smart card. The device sends the commands containing the subsets in the order that these subsets occupied in the data to be written (before the subdivision). Thus, the data written in the non-volatile memory of the smart card are identical to those that were meant to be written.

Lastly, this method comprises the processing by the smart card of each command received, according to a method according to an embodiment of the invention.

According to another embodiment, the device progressively receives or acquires the data to be written to the smart card, and sends the data to the card as they arrive (by progressively constructing the write commands). In this case, unless it receives more than 255 bytes at once (in the case of the T=0 protocol), or more than the size of the smart card buffer (if it is less than 260 bytes), the device does not need to create subsets.

If the buffer of the smart card is smaller than 260 bytes, it is advantageous to send the size of this buffer to the user device. This size may appear, for example, in the free bytes of the ATR (Answer To Reset) specified in ISO 7816. Generally, the limiting factor is the size of 255 bytes imposed by T=0 rather than the size of the buffer (which is generally at least 255 bytes), and in such a case it is therefore not necessary to send the buffer size.

One possible embodiment concerns a computer program comprising a series of instructions which, when executed by a processor of a smart card, implement the method according to an embodiment of the invention. These instructions may be, for example, instructions in an assembly language, or, for smart cards having a processor programmable by a higher level language (C or Java for example), in this higher level language.

One possible embodiment concerns a non-transitory computer-readable storage medium storing a computer program according to an embodiment of the invention. The storage medium may be, for example, the ROM, flash memory, or EEPROM of a smart card.

One possible embodiment concerns a smart card SC comprising a non-volatile memory EEPROM, a volatile memory RAM, a buffer BUF within the volatile memory, and a circuit PROC, ROM for processing write commands in non-volatile memory.

Figure 3:
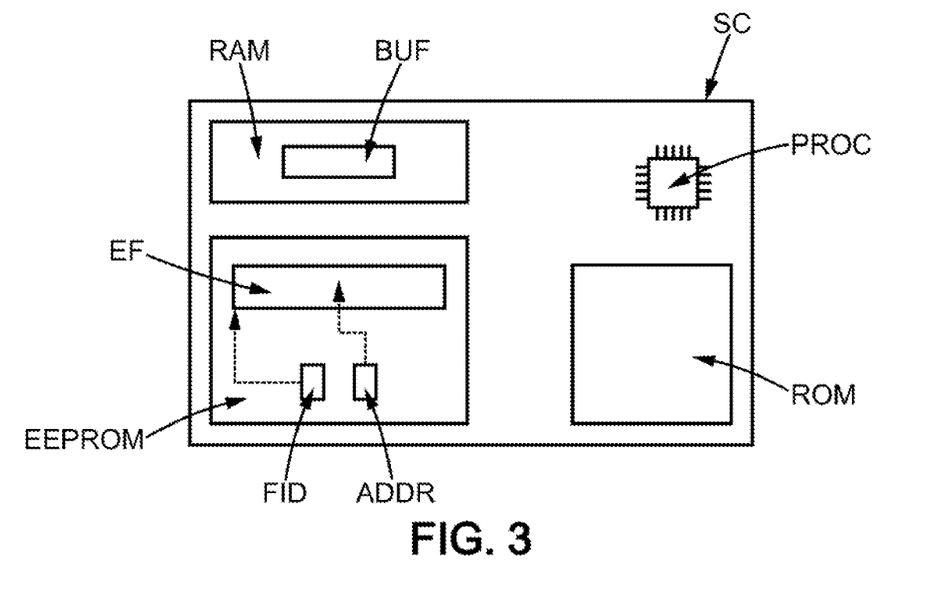
FIG. 3 schematically illustrates the architecture of a smart card according to an embodiment of the invention.

The circuit may include a smart card processor and memory (ROM for example) containing software executable by the processor and implementing a method according to an embodiment of the invention. The processor PROC represented in FIG. 3 is in the form of an integrated circuit (in a DIP package). However, this is a schematic representation, as a smart card processor is generally integrated into a microcontroller that also comprises the various memories (RAM, EEPROM, ROM . . . ). This microcontroller is typically in the form of a die (or block of semiconducting material) cut from a wafer and attached to a module in a conventional manner. The circuit may also be realized completely electronically, with no processor or software (for example using hardwired logic or a FPGA).

The circuit is arranged to process a command stored in the buffer. The command is associated with an identification parameter. The identification parameter may be stored in volatile memory. This identification parameter identifies an object stored in non-volatile memory. The command must write to this object. The circuit is also arranged to store, in the non-volatile memory, an identification parameter FID of an object EF. The object EF is stored in the non-volatile memory (it may be the above object which is associated with the command, or another object). The circuit is arranged to store, in the non-volatile memory, a predefined address ADDR. This predefined address is an address located within the object EF. The circuit is arranged, when processing a write command, to compare the object identification parameter associated with the write command with the object EF identification parameter FID stored in the non-volatile memory.

If the comparison is positive, the circuit is arranged to write the data to be written, embedded in the write command, from the buffer to the object associated with the write command, at the predefined address stored in the non-volatile memory. The circuit is arranged to calculate an address corresponding to the sum of the stored predefined address ADDR and the size of the written data. The circuit is arranged to store the calculated address in the non-volatile memory in place of the predefined address ADDR.

If the comparison is negative, the circuit is arranged to write the data to be written, embedded in the write command, from the buffer to the object associated with the write command, at a default address. The circuit is arranged to calculate an address corresponding to the sum of the default address and the size of the written data. The circuit is arranged to store the calculated address in the non-volatile memory as the predefined address.

One possible embodiment concerns a system comprising an electronic device (such as a computer PC paired with a card reader RDR) and a smart card SC according to a possible embodiment of the invention. The electronic device is arranged to separate the data, to be written by the device to the smart card, into subsets such that the size of each subset is at most equal to a predefined value. The electronic device is arranged to construct a set of write commands associated with a same object of the card, each write command comprising a respective subset of data to be written. The electronic device is arranged to send each write command constructed in this manner to the card.

The embodiments described in relation to the method of the invention can be transposed to the smart card and to the system according to the invention, as well as to the computer programs and the media for storing the program according to the invention, and vice versa.

The invention has been illustrated above with specific examples, but is not limited to these examples. In particular, the invention is applicable to smart cards in all their forms (cards with or without contacts, secure USB keys, electronic identity cards, SIM cards, bank cards, access cards, secure tokens, biometric passports, tachographs, health cards, electronic visas, SecureMMC cards, etc.). The electronic devices that send write commands to the smart card can be all sorts of devices (automated teller machine, automatic toll collector, POS payment terminal, health card reader, smart card personalization station, smart card production machine, mobile phone, computer equipped with a smart card reader, biometric passport verification station, etc.).

A write command according to an embodiment of the invention may be daisy chained, meaning that it is possible, especially when the buffer is greater than the maximum size of such a command, to send several commands one after another and only write to the non-volatile memory when the last of these commands is received. For example, if the buffer can contain three commands, and the data to be written requires twelve commands, the smart card can string together a sequence of three commands and thus execute only four write steps rather than twelve (but with data three times longer).

Although the examples given were essentially examples based on the T=0 protocol, the invention works with other protocols. For example, a write command according to an embodiment of the invention can be a command according to the T=1 protocol, with the card simply verifying that the command does not exceed the size of its buffer.

The invention claimed is:

1. A method for writing data in a non-volatile memory of a smart card, comprising:
   /a/ receiving a write command in a buffer in a volatile memory of the smart card,
   /b/ comparing, by the smart card, an object identification parameter associated with the write command, with an object identification parameter stored in the non-volatile memory of the smart card,
   /c/ if the comparison is positive,
      /c1/ writing the data to be written, embedded in the write command, from the buffer to the object associated with the write command, at a predefined address whose value is stored in the non-volatile memory,
      /c2/ calculating an address corresponding to the sum of the stored predefined address and the size of the written data,
      /c3/ storing the calculated address in the non-volatile memory in place of the predefined address,
   /d/ if the comparison is negative,
      /d1/ writing the data to be written, embedded in the write command, from the buffer to the object associated with the write command, at a default address,
      /d2/ calculating an address corresponding to the sum of the default address and the size of the written data,
      /d3/ storing the calculated address in the non-volatile memory as the predefined address.

2. The method according to claim 1, wherein the object identification parameter associated with the write command is embedded in the write command.

3. The method according to claim 1, wherein the object identification parameter associated with the write command is stored in the volatile memory, and is updated by an object selection command of the smart card.

4. The method according to claim 1, wherein the default address is the zero address.

5. The method according to claim 1, wherein the command is encoded as an APDU command according to the ISO 7816-4 standard.

6. A method for writing data in a non-volatile memory of a smart card, by an electronic device, the method comprising:
   /a/ separating, by the device, the data to be written into subsets, such that the size of each subset is at most equal to a predefined value,
   /b/ constructing a set of write commands associated with a same object of the card, each write command containing a respective subset of data to be written,
   /c/ sending each write command to the smart card by the device,
   /d/ processing by the smart card each command received, according to the method according to claim 1.

7. A non-transitory computer-readable medium storing thereon a computer program comprising a series of instructions which, when executed by a processor of a smart card, implement the method comprising:
   /a/ receiving a write command in a buffer in a volatile memory of the smart card,
   /b/ comparing, by the smart card, an object identification parameter associated with the write command, with an object identification parameter stored in the non-volatile memory of the smart card,
   /c/ if the comparison is positive,
      /c1/ writing the data to be written, embedded in the write command, from the buffer to the object associated with the write command, at a predefined address whose value is stored in the non-volatile memory,
      /c2/ calculating an address corresponding to the sum of the stored predefined address and the size of the written data,
      /c3/ storing the calculated address in the non-volatile memory in place of the predefined address,
   /d/ if the comparison is negative,
      /d1/ writing the data to be written, embedded in the write command, from the buffer to the object associated with the write command, at a default address,
      /d2/ calculating an address corresponding to the sum of the default address and the size of the written data,
      /d3/ storing the calculated address in the non-volatile memory as the predefined address.

8. A smart card (SC) comprising a non-volatile memory (EEPROM), a volatile memory (RAM), a buffer (BUF) within the volatile memory, and a circuit (PROC, ROM) for processing write commands in non-volatile memory, said circuit (PROC, ROM) being arranged to process a command stored in the buffer (BUF) and associated with an identification parameter identifying an object stored in the non-volatile memory (EEPROM) where the command is to write to, said circuit (PROC, ROM) being arranged to store, in the non-volatile memory (EEPROM), on the one hand an identification parameter (FID) of an object (EF), the object (EF) being stored in the non-volatile memory (EEPROM), and on the other hand a predefined address (ADDR) within the object (EF), the circuit (PROC, ROM) being arranged, when processing a write command, to compare the object identification parameter associated with the write command with the object (EF) identification parameter (FID) stored in the non-volatile memory (EEPROM), and, if the comparison is positive, to write the data to be written, embedded in the write command, from the buffer (BUF) to the object associated with the write command, at the predefined address (ADDR) stored in the non-volatile memory (EEPROM), calculate an address corresponding to the sum of the stored predefined address (ADDR) and the size of the written data, as well as store the calculated address in the non-volatile memory (EEPROM) in place of the predefined address (ADDR), the circuit (PROC, ROM) being arranged, if the comparison is negative, to write the data to be written, embedded in the write command, from the buffer (BUF) to the object associated with the write command, at a default address, calculate an address corresponding to the sum of the default address and the size of the written data, and store the calculated address in the non-volatile memory (EEPROM) as the predefined address.

9. A system comprising an electronic device (PC, RDR) and a smart card (SC) according to claim 8, the electronic device (PC, RDR) being arranged to separate the data, to be written by the device (PC, RDR) to the smart card (SC), into subsets such that the size of each subset is at most equal to a predefined value, construct a set of write commands associated with a same object of the card (SC), each write command comprising a respective subset of data to be written, and send each write command constructed in this manner to the card (SC).

* * * * *